United States Patent
Lee et al.

(10) Patent No.: US 8,779,566 B2
(45) Date of Patent: Jul. 15, 2014

(54) FLEXIBLE ROUTING FOR HIGH CURRENT MODULE APPLICATION

(75) Inventors: Lee Han Meng @ Eugene Lee, Muar (MY); Yien Sien Khoo, Alor Gajah (MY); Kuan Yee Woo, Tampin (MY)

(73) Assignee: National Semiconductor Corporation, Santa Clara, CA (US)

( * ) Notice: Subject to any disclaimer, the term of this patent is extended or adjusted under 35 U.S.C. 154(b) by 526 days.

(21) Appl. No.: 13/210,135

(22) Filed: Aug. 15, 2011

(65) Prior Publication Data

US 2013/0045572 A1 Feb. 21, 2013

(51) Int. Cl.
- *H01L 23/495* (2006.01)
- *H01L 23/522* (2006.01)
- *H01L 25/16* (2006.01)
- *H01L 25/18* (2006.01)

(52) U.S. Cl.
USPC ........... 257/668; 257/675; 257/687; 257/693; 257/724; 257/738; 257/777; 257/780; 438/107; 438/112; 438/126; 438/613

(58) Field of Classification Search
USPC .......................... 257/306, 341, 401, 692, 686
See application file for complete search history.

(56) References Cited

U.S. PATENT DOCUMENTS

| | | | |
|---|---|---|---|
| 3,902,148 A * | 8/1975 | Drees et al. | 257/669 |
| 5,432,358 A * | 7/1995 | Nelson et al. | 257/81 |
| 5,530,282 A | 6/1996 | Tsuji | |
| 5,926,695 A | 7/1999 | Chu et al. | |
| 5,994,768 A | 11/1999 | Fogelson | |
| 6,061,251 A | 5/2000 | Hutchison et al. | |
| 6,064,115 A | 5/2000 | Moscicki | |
| 6,066,515 A | 5/2000 | Schoenfeld et al. | |
| 6,072,228 A | 6/2000 | Hinkle et al. | |
| 6,215,176 B1 | 4/2001 | Huang et al. | |
| 6,372,579 B1 | 4/2002 | Tung | |
| 6,448,107 B1 | 9/2002 | Hong et al. | |
| 6,483,180 B1 | 11/2002 | Bayan et al. | |
| 6,603,072 B1 * | 8/2003 | Foster et al. | 174/536 |
| 6,781,243 B1 | 8/2004 | Li et al. | |

(Continued)

FOREIGN PATENT DOCUMENTS

JP 06-177315 6/1994

OTHER PUBLICATIONS

Search Report dated Feb. 28, 2011 from International Application No. PCT/US2010/045802.

(Continued)

*Primary Examiner* — Olik Chaudhuri
*Assistant Examiner* — John M Parker
(74) *Attorney, Agent, or Firm* — Eugene C. Conser; Frederick J. Telecky, Jr.

(57) ABSTRACT

In one aspect of the invention, an integrated circuit package is described. The integrated circuit package includes a substrate formed from a dielectric material that includes multiple electrical contacts and conductive paths. An upper lead frame is attached with and underlies the substrate. The upper lead frame is electrically connected with at least one of the contacts on the substrate. The active surface of an integrated circuit die is electrically and physically coupled to the upper lead frame through multiple electrical connectors. A lower lead frame may be attached with the back surface of the integrated circuit die. A passive device is positioned on and electrically connected with one of the contacts on the substrate and/or the upper lead frame.

10 Claims, 7 Drawing Sheets

(56) References Cited

U.S. PATENT DOCUMENTS

| | | | |
|---|---|---|---|
| 6,861,288 B2* | 3/2005 | Shim et al. | 438/109 |
| 7,102,209 B1 | 9/2006 | Bayan et al. | |
| 7,566,966 B2* | 7/2009 | Chow et al. | 257/723 |
| 7,612,435 B2 | 11/2009 | Bayan et al. | |
| 7,923,825 B2 | 4/2011 | Bayan et al. | |
| 8,269,330 B1* | 9/2012 | Lee et al. | 257/686 |
| 2001/0018235 A1* | 8/2001 | Choi | 438/122 |
| 2002/0024857 A1 | 2/2002 | Stave | |
| 2003/0038346 A1* | 2/2003 | Beer et al. | 257/666 |
| 2007/0001274 A1 | 1/2007 | Hinkle et al. | |
| 2007/0132075 A1 | 6/2007 | Masumoto | |
| 2008/0017907 A1* | 1/2008 | Otremba | 257/306 |
| 2008/0047740 A1* | 2/2008 | Lien et al. | 174/256 |
| 2008/0136003 A1* | 6/2008 | Pendse | 257/686 |
| 2011/0089546 A1 | 4/2011 | Bayan | |
| 2011/0140249 A1 | 6/2011 | Lee et al. | |
| 2012/0313229 A1* | 12/2012 | Lee et al. | 257/675 |

OTHER PUBLICATIONS

Written Opinion dated Feb. 28, 2011 from International Application No. PCT/US2010/045802.
Search Report dated Feb. 28, 2011 from International Application No. PCT/US2010/045803.
Written Opinion dated Feb. 28, 2011 from International Application No. PCT/US2010/045803.
Notice of Allowance dated Aug. 25, 2009 from U.S. Appl. No. 11/963,388.
Office Action dated May 11, 2009 from U.S. Appl. No. 11/963,388.
Notice of Allowance dated Feb. 15, 2011 from U.S. Appl. No. 12/553,919.

* cited by examiner

FLEXIBLE ROUTING FOR HIGH CURRENT MODULE APPLICATION

FIELD OF THE INVENTION

The present invention relates to the packaging of integrated circuits. More specifically, a particular aspect of the present invention relates to a package design that includes one or more integrated circuits and passive devices, a lower lead frame and a substrate that is coupled with an upper lead frame.

BACKGROUND OF THE INVENTION

There are a number of conventional processes for packaging integrated circuit (IC) dice. By way of example, many IC packages utilize a metallic lead frame that has been stamped or etched from a metal sheet to provide electrical interconnects to external devices. The die may be electrically connected to the lead frame by means of bonding wires, solder bumps or other suitable electrical connections. In general, the die and portions of the lead frame are encapsulated with a molding material to protect the delicate electrical components on the active side of the die while leaving selected portions of the lead frame exposed to facilitate electrical connection to external devices.

While existing arrangements and methods for packaging IC devices work well, there are continuing efforts to both miniaturize the size of IC devices and improve the thermal performance of IC devices.

SUMMARY OF THE INVENTION

In one aspect of the invention, an integrated circuit package will be described. The integrated circuit package includes a substrate formed from a dielectric material that includes multiple electrical contacts and conductive paths. An upper lead frame is in contact with and underlies the substrate. The upper lead frame is electrically connected with at least one of the contacts on the substrate. The active surface of an integrated circuit die is electrically and physically coupled to the upper lead frame through a plurality of electrical connectors (e.g. solder joints.) A lower lead frame underlies and is attached with the back surface of the integrated circuit die. The lower lead frame is exposed at the exterior of the package and is arranged to help dissipate heat from the integrated circuit die. A passive device is positioned on and electrically connected with one of the contacts on the substrate and/or the upper lead frame. The package may also include multiple dice and/or passive devices. Almost any type of passive device may be used (e.g., capacitors, inductors, diodes, etc.)

Various implementations involve an upper lead frame with openings that define multiple inner leads. These inner leads are electrically connected to the active surface of the integrated circuit die with multiple electrical connectors. The substrate is positioned flush against a top surface of the upper lead frame to at least partially cover the openings around the inner leads. An underfill material is applied to help secure the integrated circuit die to the inner leads. When the underfill material is applied, the substrate serves as a base for the underfill material. That is, the substrate helped seal off the openings in the upper frame and prevent the underfill material from spreading in an undesirable manner.

In some embodiments, there is an electrical connector that directly connects the active surface of the integrated circuit die to one of the contacts on the substrate. This electrical connector may be formed in any suitable manner. For example, a direct electrical and physical connection between the substrate and the active surface of the integrated circuit die can be formed from two or more stacked solder balls that are deposited sequentially on the substrate.

In another embodiment, the back surface of the integrated circuit die includes an electrically grounded contact. This contact is connected using an electrically conductive adhesive to the lower lead frame, which is also electrically grounded. Various leads in the upper lead frame and contacts on the substrate may also be electrically grounded and coupled with the lower lead frame through the integrated circuit die.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

Figure 1:
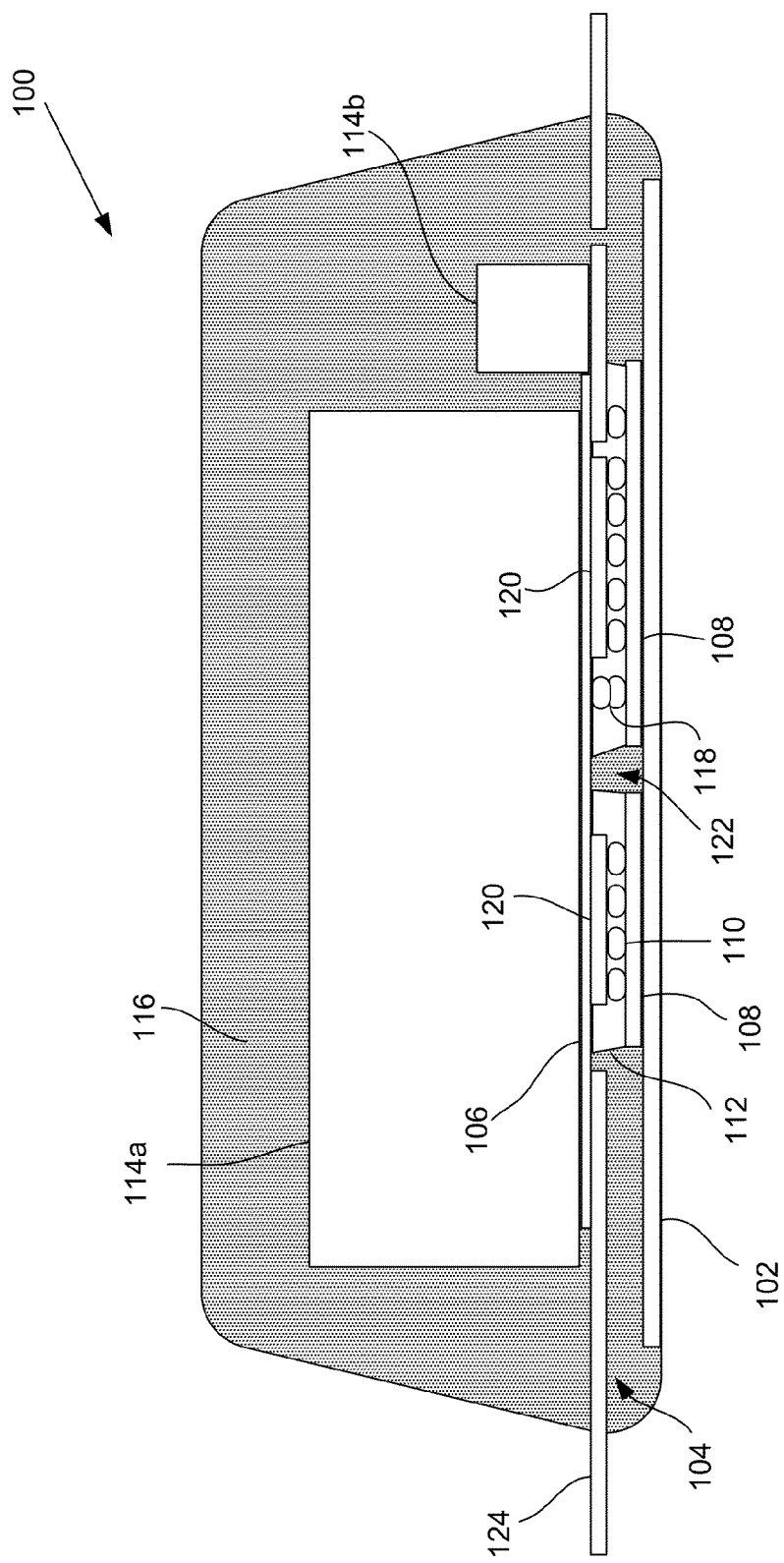
FIG. 1 is a diagrammatic side view of integrated circuit package according to a particular embodiment of the present invention.

The present invention relates generally to integrated circuit packages. A particular embodiment relates to an integrated circuit package with an upper lead frame and a lower lead frame that are coupled with a substrate, an integrated circuit and a passive device. In various implementations, this package design has improved thermal performance and provides flexible routing for high current applications.

FIG. 1A is a side view of an integrated circuit package 100 according to a particular embodiment of the present invention. The integrated circuit package 100 includes a lower lead frame 102 and an upper lead frame 104 whose top surface is secured to a substrate 106. The substrate 106, which is formed partly from a dielectric material, includes electrical contacts on its top and bottom surfaces and multiple conductive paths. One or more integrated circuit dice 108 are sandwiched between the upper lead frame 104 and the lower lead frame 102. Each integrated circuit die 108 is electrically and physically connected with the upper lead frame 104 using multiple electrical connectors 110 (e.g., solder joints.) Underfill material 112 is applied over the electrical connectors 110 to help adhere the dice 108 to the upper lead frame 104. One or more passive devices 114a/114b (e.g., inductors, capacitors, resistors, diodes, etc.) are electrically and physically connected to a top surface of the substrate 106 and/or a top surface of the upper lead frame 104. A molding material 116 encapsulates the passive devices 114a/114b, the integrated circuit dice 108, the substrate 116 and the lead frames.

One advantage of the integrated circuit package 100 is that it offers a wide variety of routing paths for low- and high-current applications. In the illustrated embodiment, for example, there is a high current routing path that passes through the upper lead frame 104. There is also a low current routing path that passes through the substrate 106. It should be noted that there is a direct electrical connection 118 between the active surface of an integrated circuit die 108 and an electrical contact on the bottom surface of the substrate 106. This direct connection 118, which bypasses the upper lead frame 104, may be formed in any suitable manner, such as from multiple stacked solder balls.

The back surfaces of the integrated circuit dice 108 are thermally and physically coupled to an underlying lower lead frame 102. The molding material 116 leaves the bottom surface of the lower lead frame exposed 102. Accordingly, heat is dissipated from the integrated circuit dice 108 through the lower lead frame 102 to the exterior of the package. Preferably, the exposed surface of the lower lead frame 102 is substantially larger than the bottom surfaces of the integrated circuit dice 108, so that heat can be transferred more quickly out of the package.

In various embodiments, the bottom surfaces of the integrated circuit dice 108 include an electrically grounded contact that is coupled to the lower lead frame 102, which is also electrically grounded. One or more electrical connectors 110 on the dice, conductive paths in the substrate 106 and/or leads of the upper lead frame may also be electrically grounded and electrically coupled with the lower lead frame 102. In such embodiments, the integrated circuit dice 108 are secured with the top surface of the lower lead frame 102 using a thermally and electrically conductive adhesive.

In addition to providing a greater array of routing options within the package, the substrate 106 is positioned to serve as a base for the underfill material 112, which helps strengthen the mechanical bond between the dice 108 and the upper lead frame 106. That is, there are openings 122 in the upper lead frame that helps define leads and other structures in the upper lead frame 104. In the illustrated embodiment, for example, each integrated circuit 108 die is connected to multiple inner leads 120 of the upper lead frame 104. During the packaging process, when underfill material 112 is applied between the dice 108 and the inner leads 120 to help strengthen this connection, the substrate 106 overlies and helps seal off the openings 122 in the upper lead frame 104 to contain the underfill material 112. Accordingly, some of the underfill material 112 extends through the openings 122 in the upper lead frame 104 (e.g, between the inner leads 120) and comes in direct contact with portions of the bottom surface of the substrate 106. The underfill material 112 may be made of any suitable material known to persons of ordinary skill in the art (e.g., an epoxy resin, etc.)

Generally, the substrate 106 is formed from one or more dielectric layers. By way of example, Bismaleimidetriazine (BT) and FR4 work well as materials for the substrate, although any suitable insulating material may be used. In various embodiments, there are electrical contacts on the top and bottom surfaces of the substrate 106 that are coupled with embedded conductive paths that extend through the substrate. Each contact, which is isolated from the other contacts on the same surface by the dielectric material, are arranged to be connected with an external electrical structure, such as a passive device 114a/114b, the upper lead frame 104 and/or an integrated circuit die 108.

The upper and lower lead frames 104/102 may be made of any suitable electrically conductive material, such as copper. The thickness of a lead frame may be between 3 and 12 mils, although thinner and thicker lead frames are also possible. In a particular embodiment, the upper lead frame 104 includes outer leads 124 and one or more sets of inner leads 120. Each set of inner leads 120 is arranged to be electrically coupled to the active surface of an integrated circuit die 108. The outer leads 124 are arranged to electrically connect the upper lead frame 104 to a device that is outside of the integrated circuit package 100.

The lower lead frame 102 is arranged to facilitate heat dissipation from the integrated circuit dice 108. Preferably, substantially the entire bottom surface of the lower lead frame 102 is exposed and left uncovered by the molding material 116, although this is not a requirement. The lower lead frame 102 may be designed in any suitable manner. In some embodiments, the entire lower lead frame 102 is electrically grounded.

The integrated circuit package 100 may include almost any number and type of passive devices 114a/114b (e.g., capacitors, inductors, diodes, resistors, etc.) In the illustrated embodiment, for example, an inductor (e.g., passive device 114a) is electrically attached to a top surface of the substrate 106, while multiple capacitors (e.g., passive device 114b) are attached to the top surface of the upper leadframe 104, although a wide variety of other arrangements are also possible. In this example, the inductor is electrically coupled through conductive paths in the substrate and/or the upper lead frame 104 to at least one of the integrated circuit dice 108. The capacitors are also electrically coupled with at least one of the integrated circuit dice 108 through the upper lead frame 104.

Referring next to FIG. 2 and FIGS. 3A-3L, a method 200 of forming the integrated circuit package 100 illustrated in FIG. 1 will be described. Initially, an upper lead frame panel is provided. FIGS. 3A and 3B are side and top views of the upper lead frame 104 according to a particular embodiment of the present invention. In this example, there are openings 122 that define one or more sets of inner leads 120 in the upper lead frame. The upper lead frame 104 also includes outer leads 124. Each set of inner leads 120 is arranged to be electrically and physically attached with an integrated circuit die.

The outer leads 124, which are situated at the periphery of the upper lead frame, are arranged to electrically couple the upper lead frame 104 with an external device. The inner leads 120 are generally situated substantially inward and away from the outer leads 124 frame (e.g., at or closer to the center of the upper lead frame 104.) It should be appreciated that although FIG. 3B illustrates three sets of inner leads 120 for supporting three integrated circuit dice, the present invention also contemplates upper lead frame designs that have fewer or more sets of inner leads for supporting almost any number of integrated circuit dice.

Figure 3A:
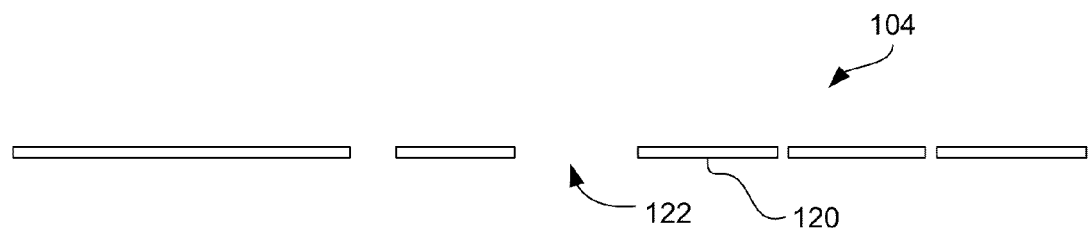
FIGS. 3A-3L illustrate steps in the method of FIG. 2 according to various embodiments of the present invention.
Figure 3B:
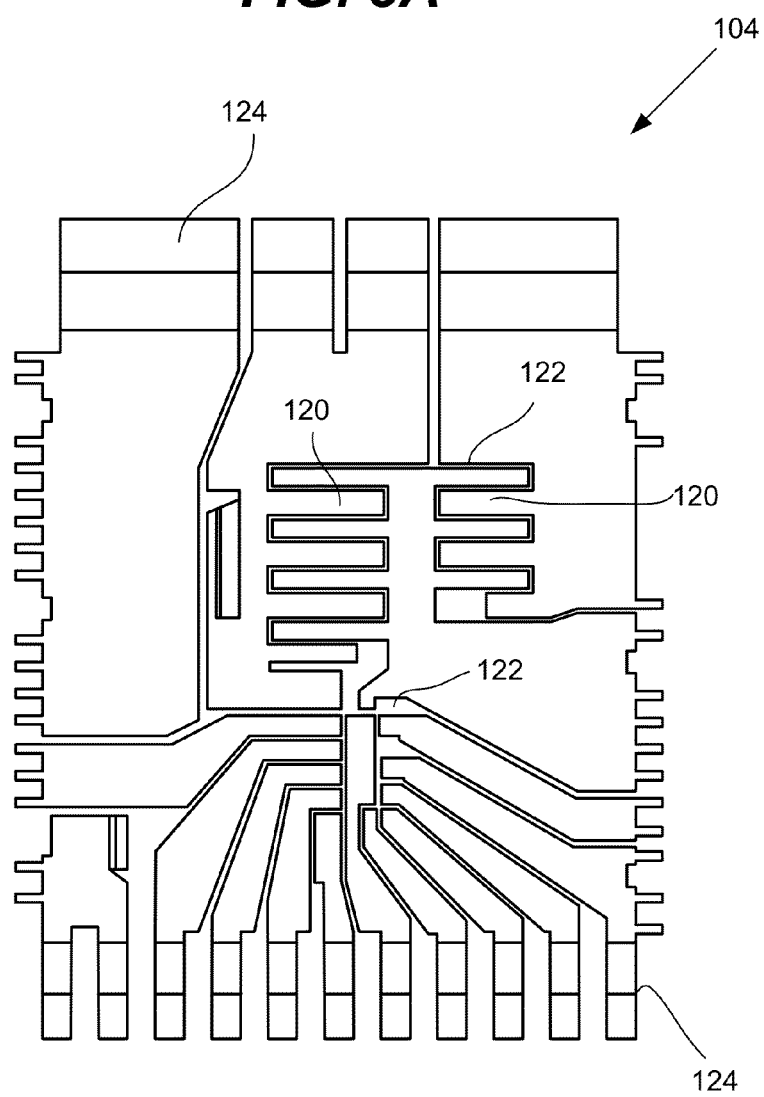
Figure 3C:
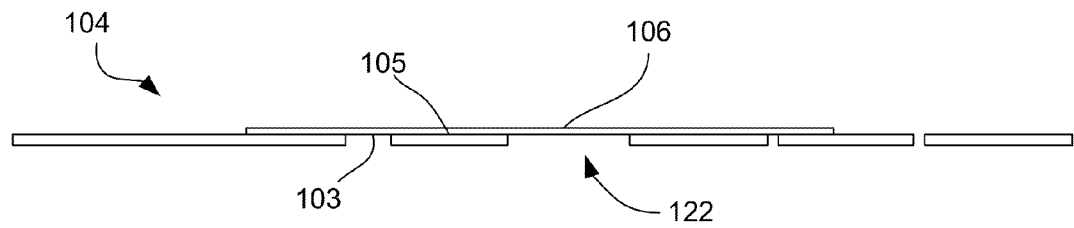
Figure 3D:
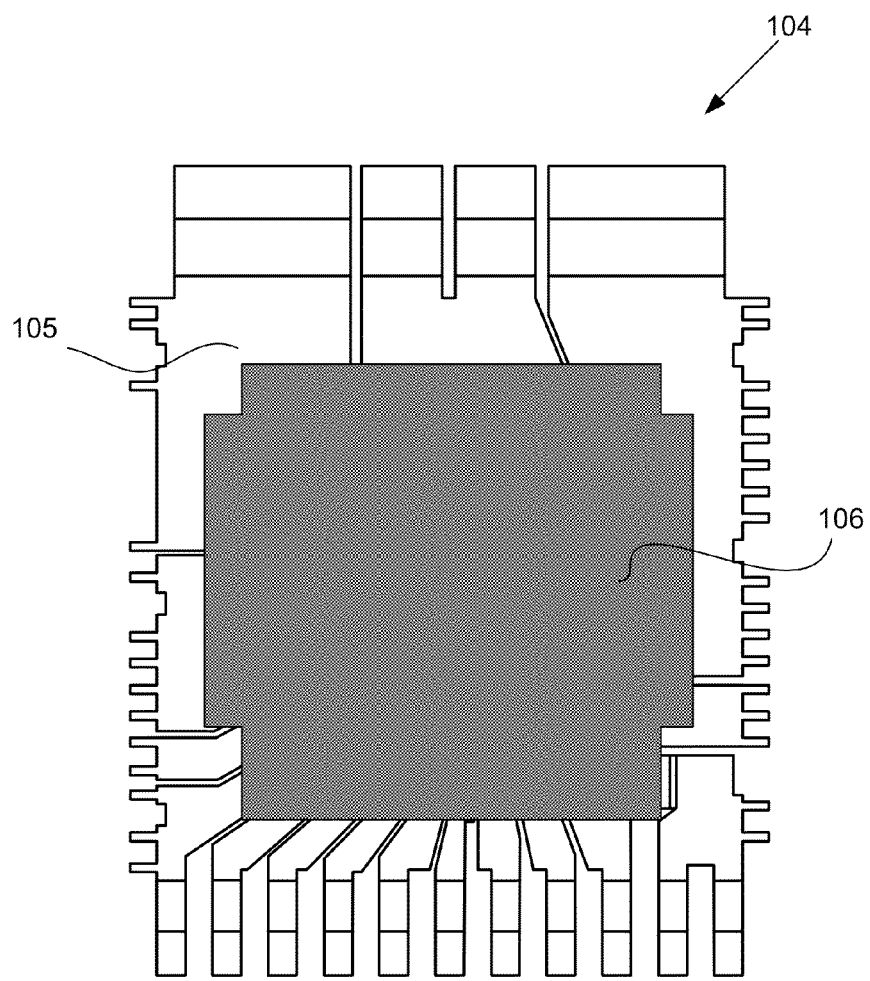

At step 202, a substrate 106 is attached to the upper lead frame 104. FIGS. 3C and 3D are side and top views of the upper lead frame after the attachment of the substrate 106. In the illustrated embodiment, the substrate 106 is positioned flush against the top surface 105 of the upper lead frame 104. As a result, the substrate 106 overlies and helps seal off some of the openings 122 in the upper lead frame 104. In some embodiments, the substrate 106 overlies at least a majority of the surface area of the top surface 105 of the upper lead frame 104, although in other embodiments the substrate occupies less space.

The substrate 106 may be attached to the upper lead frame 104 in various ways, depending on the needs of a particular application. In the illustrated embodiment, for example, there are electrical contacts on the bottom surface 103 of the substrate. These electrical contacts are coupled to conductive paths that extend through the interior of the substrate. Solder is selectively dispensed at suitable locations to electrically and physically connect the electrical contacts of the substrate with at least some of the inner leads.

Figure 2:
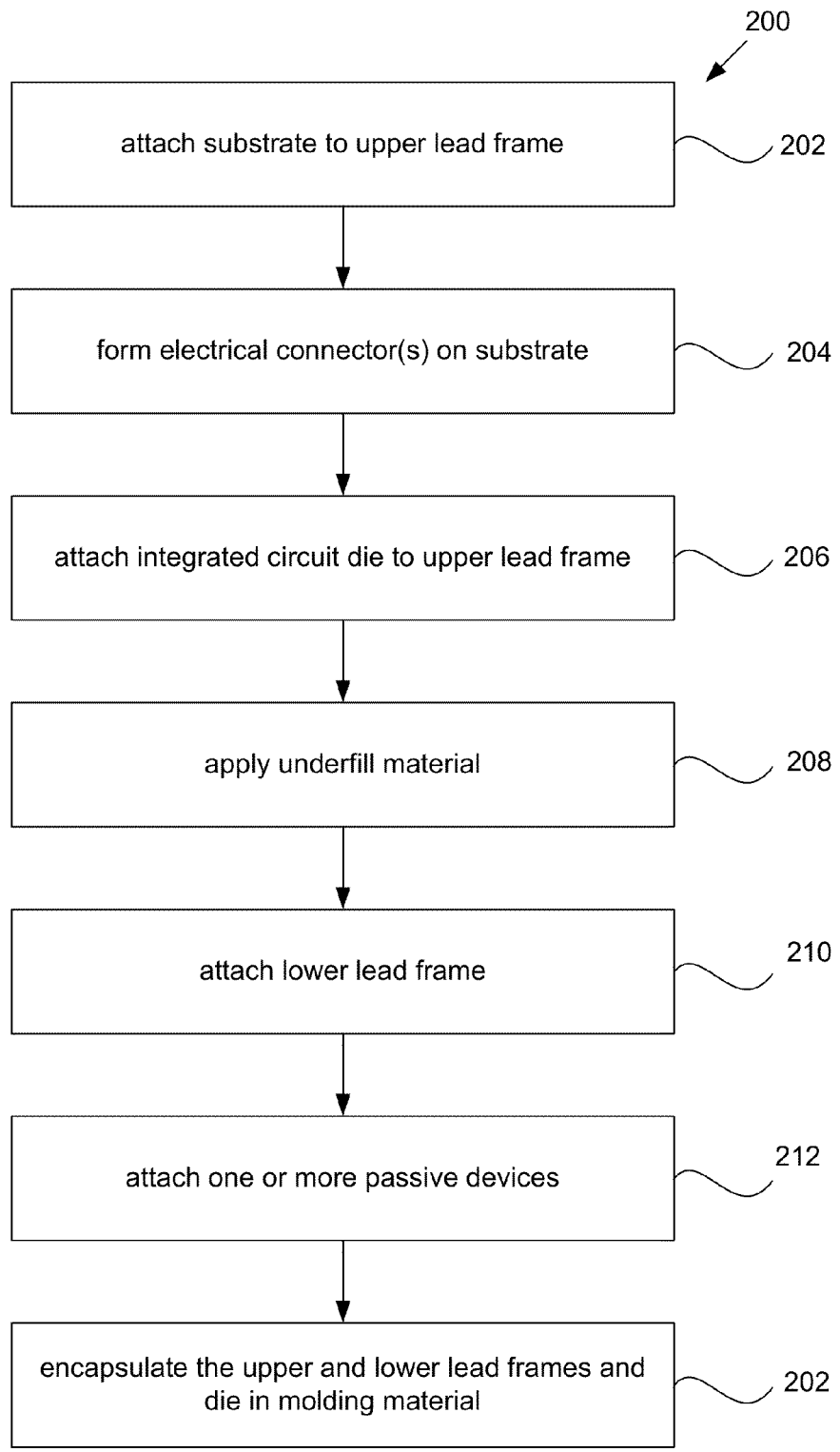
FIG. 2 is a method for forming the integrated circuit package illustrated in FIG. 1.

One or more electrical connectors are then optionally formed on the substrate (step 204 of FIG. 2.) Any suitable technique may be used to form the electrical connectors. FIG.

3E illustrates one approach in which the upper lead frame 104 is flipped over and solder balls are deposited onto a bottom surface 103 of the substrate 106. In this example, two solder balls 111 are deposited or stacked over one another. These stacked solder balls will later be used to form a direct electrical connection between a contact on the substrate 106 and a bond pad on an underlying integrated circuit die.

Figure 3E:
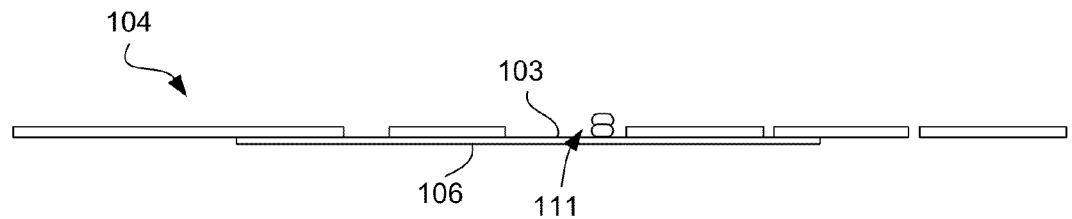
Figure 3F:
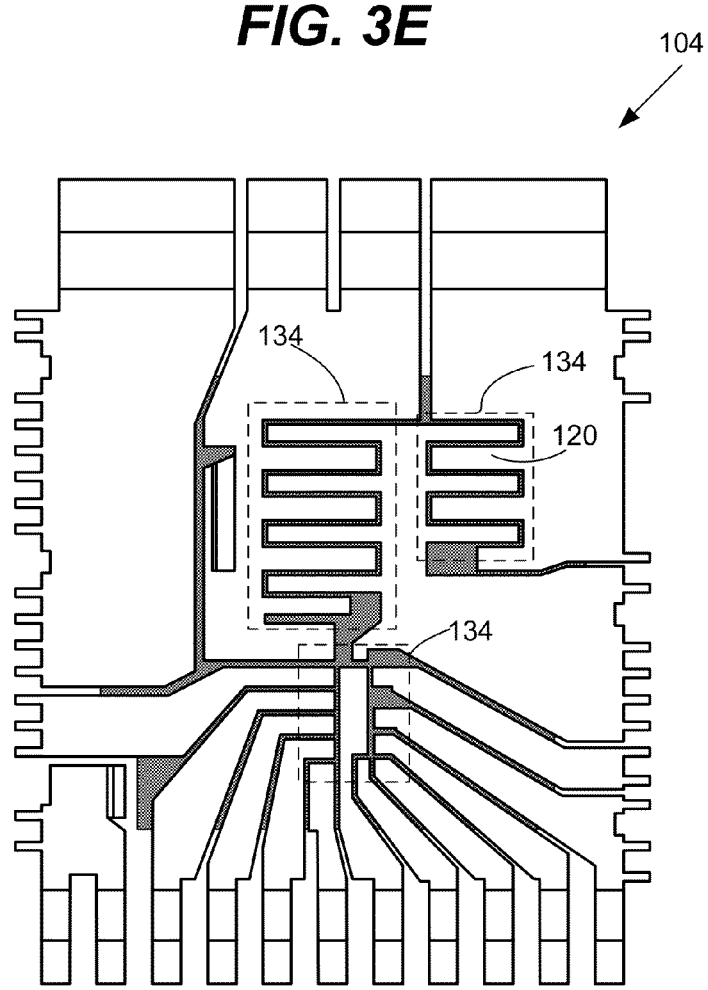
Figure 3G:
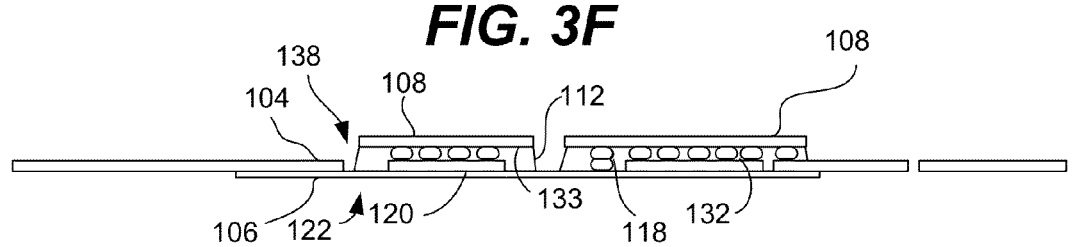

Afterward, one or more integrated circuit dice are attached to the upper lead frame 104 (step 206). This step may be performed in a wide variety of ways, depending on the needs of a particular application. In the embodiment illustrated in FIG. 3G, for example, each integrated circuit die 108 is attached using solder balls 132 to a set of inner leads 120. Preferably, the solder balls 132 have been pre-attached to the integrated circuit dice 108 prior to the performance of this step, although this is not a requirement. The active surfaces 133 of the integrated circuit dice 108 are aligned over their corresponding sets of inner leads 120. (FIG. 3F, which is a top view of the upper lead frame 104 illustrated in FIG. 3E, shows example attachment sites 134 where the integrated circuit dice 108 will be positioned.) The solder balls 132 on the dice 108 are then reflowed to electrically and physically attach the dice 108 to their corresponding inner leads 120. It should be noted that the electrical connector formed in step 204 is also reflowed during the step. Accordingly, the electrical connector then forms a direct electrical connection 118 between a contact on the surface of the substrate 106 and a bond pad on the active surface 133 of the integrated circuit die 108.

Underfill material 112 is then applied below each integrated circuit die (step 208). The step may be performed using any technique and underfill material that are known to persons of ordinary skill in the field of semiconductor packaging. By way of example, an epoxy works well for various applications. In the illustrated embodiment of FIG. 3G, the underfill material 112 encapsulates the electrical connectors and portions of the inner leads 120 and fills the space between the active surface 133 of each integrated circuit die 108 and its corresponding set of inner leads 120.

Without the substrate 106, the application of the underfill material 112 would be more difficult or impossible. By being positioned flush against the upper lead frame 104, the substrate 106 helps prevent the underfill material 112 from escaping to the other side of the upper lead frame 104. That is, the openings 122 in the upper lead frame 104, which penetrate entirely through the upper lead frame 104, are at least partially sealed off at one end by the substrate 106. The underfill material 112 fills a recess 138 formed by this arrangement, passes through the openings 122 and comes in direct contact with the substrate 106.

Figure 3H:
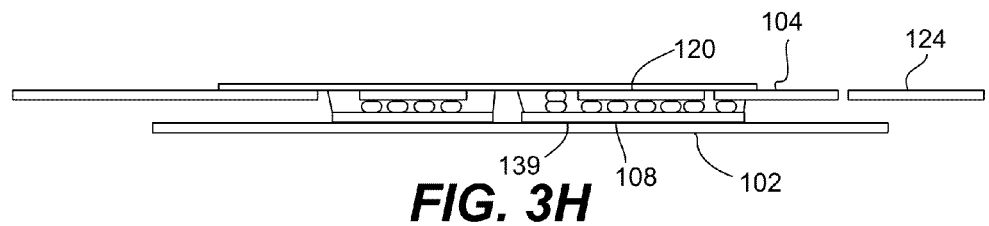

In the example illustrated in FIG. 3H, the populated upper lead frame 104 is then flipped over again. At step 210 of FIG. 2, a lower lead frame 102 is attached with the integrated circuit dice 108 on the upper lead frame 104. The back surfaces 139 of the integrated circuit dice 108 are then attached to the lower lead frame 102. Preferably, a thermally and electrically conductive adhesive is used to form this bond. For some applications, it is desirable to attach an electrically grounded contact on the back surface of each die to the lower lead frame 102, which is also electrically grounded. Various implementations involve other interconnect structures of the integrated circuit package (e.g., an inner lead 120, an outer lead 124, a conductive path or contact in the substrate 106) being electrically grounded and electrically coupled with the lower lead frame 102 as well.

Figure 3I:
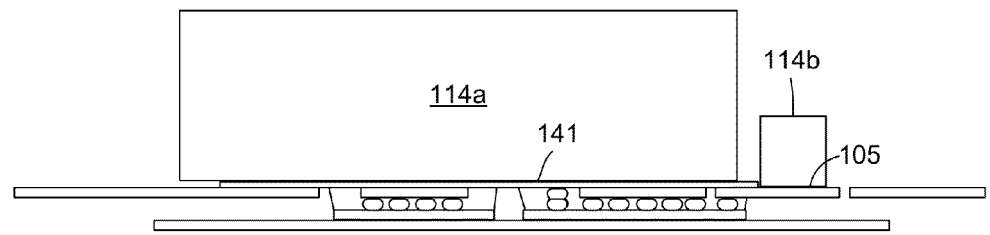

One or more passive devices (e.g., passive devices 114*a* and 114*b*) are then attached (step 212 of FIG. 2 and FIG. 3I.) Almost any number or type of passive devices may be used, including inductors, capacitors, diodes, resistors, etc. Generally, each passive device is electrically and physically coupled to a contact on the top surface 141 of the substrate 106 and/or a lead or contact on the top surface 105 of the upper lead frame 104. In the illustrated embodiment, for example, an inductor (e.g., passive device 114*a*) is mounted on the top surface 141 of the substrate 106. Solder is dispensed selectively to secure electrical contacts on the substrate 106 to electrical contacts on the inductor. Additionally, a capacitor (e.g., passive device 114*b*) is electrically coupled to a top surface 105 of the upper lead frame 104. Each of these passive devices may be electrically coupled with one or more of the integrated circuit dice 108 through the substrate 106 and/or the upper lead frame 104.

Figure 3J:
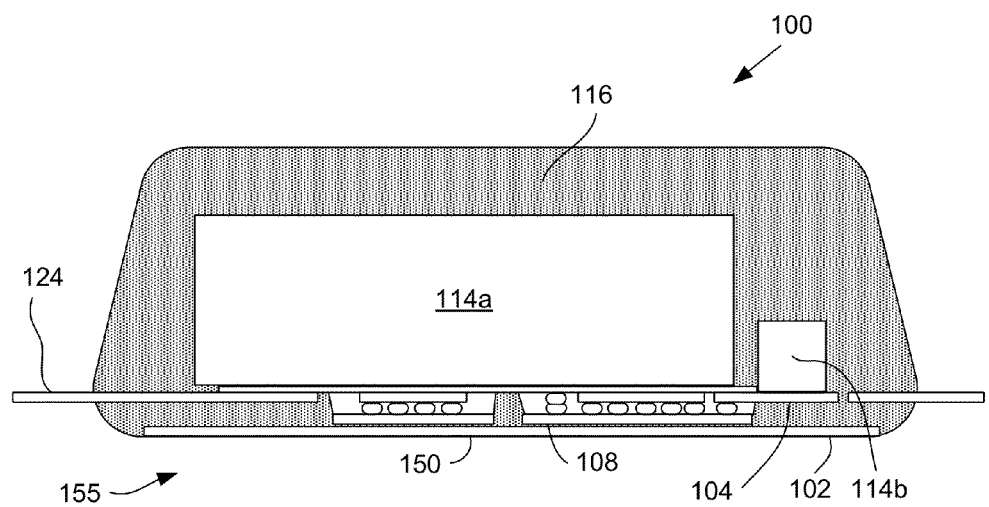
Figure 3K:
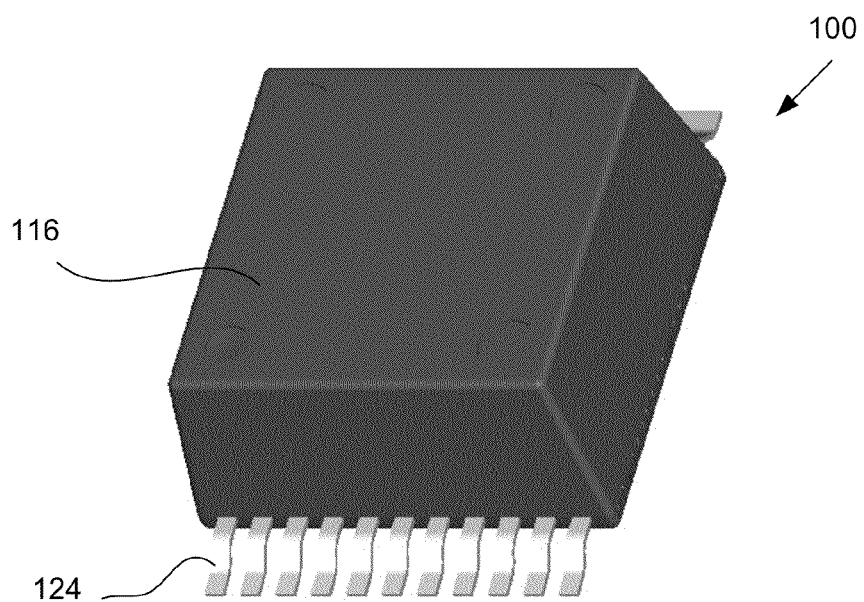
Figure 3L:
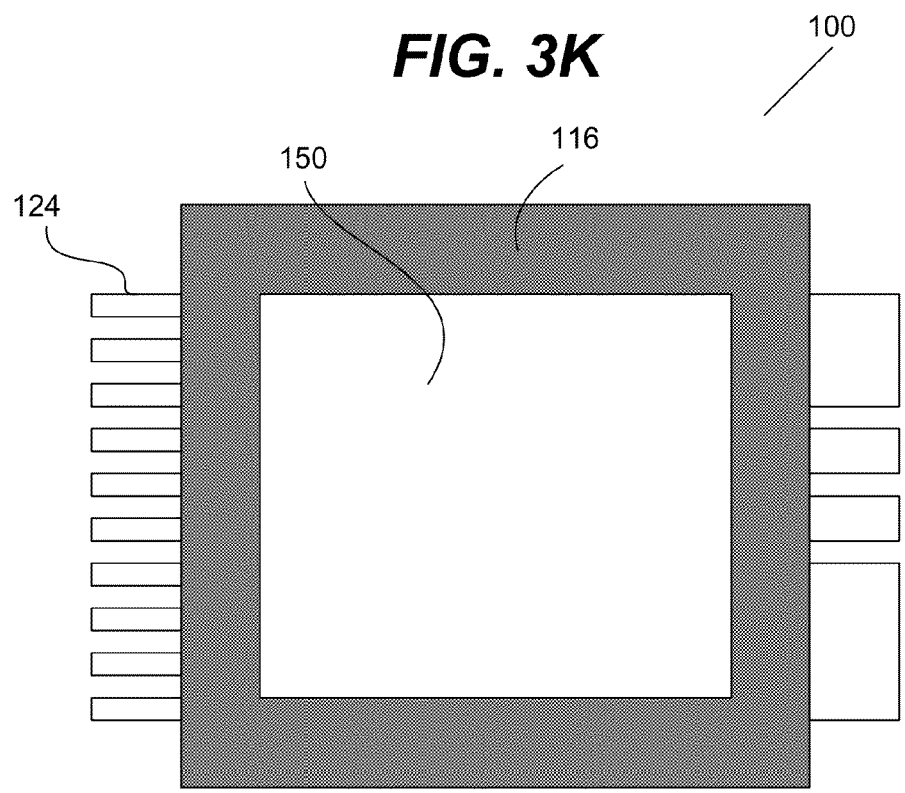

At step 214 of FIG. 2, a molding material 116 is applied to encapsulate the passive devices 114*a*/114*b*, the upper and lower lead frames 104/102, and the integrated circuit dice 108 (FIGS. 3J-3L.) FIGS. 3J, 3K and 3L are side, perspective and bottom views of the integrated circuit package 100 after the molding process. In the illustrated embodiment, external leads 124 extend out of the molding material 116 and may be arranged in any suitable shape or manner (e.g., gull wing, etc.) Preferably, the molding material 116 is applied in such a manner that all or a portion of the bottom surface 150 of the lower lead frame 102 is left uncovered. In various embodiments, the surface area of the exposed bottom surface 150 of the lower lead frame 102 forms at least a majority of the surface area of the bottom surface 155 of the package 100. This broad, exposed bottom surface 150 helps transfer heat generated by the integrated circuit dice 108 out of the package 100.

Although only a few embodiments of the invention have been described in detail, it should be appreciated that the invention may be implemented in many other forms without departing from the spirit or scope of the invention. In the foregoing description, many of the described lead frames include leads and/or contacts. In the context of this invention, the term lead is intended to encompass leads, contacts and other electrical interconnect structures that may be present within a lead frame. Although various specific designs are described in the specification and shown in the figures, it should be appreciated that the present invention also contemplates many variations on these designs. For example, the steps of the method illustrated in FIG. 2 may be reordered or altered. One or more steps may be modified, removed or replaced for particular applications. In some variations on the package design illustrated in FIG. 1, there is no lower lead frame. Instead, the back surfaces of the dice are exposed on the exterior of the package. The passive devices may be placed in almost any arrangement, including ones that depart from what is shown in the example figures. The leadframes may have any suitable design or arrangement of leads and other interconnect structures. In the foregoing application, it should be appreciated that the present invention contemplates various embodiments with characteristics that are implied in the drawings but that are not specifically identified in the specification. For example, FIG. 3E provides support for an embodiment in which the electrical connector (e.g., two solder balls 111) extend out of and/or extend perpendicular to the bottom surface 103 of the upper lead frame 104. Additionally, there are various structures that are described as having a top surface and a bottom surface. In various embodiments, these surfaces are understood as being opposite one another. The active and back surfaces of a die may also be understood as being opposite one another. Therefore, the present embodiments should be considered as illustrative and not restrictive and the invention is not limited to the details given herein, but may be modified within the scope and equivalents of the appended claims.

What is claimed is:

1. An integrated circuit package comprising:
a substrate formed from a dielectric material that includes a plurality of electrical contacts and a plurality of conductive paths;
a first lead frame that is in contact with and underlies the substrate, the first lead frame being electrically connected with at least one of the contacts on the substrate;
a first integrated circuit die having an active surface and an opposing back surface, the active surface of the first integrated circuit die being electrically and physically coupled to the first lead frame through a plurality of electrical connectors;
a second lead frame that underlies and is attached with the back surface of the first integrated circuit die, the second lead frame being exposed at the exterior of the package and arranged to help dissipate heat from the first integrated circuit die wherein the first integrated circuit die is sandwiched between the first and second lead frames;
a first passive device that is positioned on and electrically connected with at least one selected from the group consisting of (a) one of the contacts on the substrate and (b) the first lead frame;
the first lead frame further includes openings that define a plurality of inner leads;
the substrate is positioned adjacent to the first lead frame and at least partially covers said openings in the first lead frame;
the active surface of the first integrated circuit die are attached to the inner leads of the first lead frame with the plurality of electrical connectors;
the back surface of the first integrated circuit die includes an electrically grounded contact;
the electrically grounded contact on the back surface of the first integrated circuit die is electrically coupled to the second lead frame, which is also electrically grounded; and
at least one of the plurality of inner leads is electrically grounded and is electrically coupled with the second lead frame through the first integrated circuit die.

2. An integrated circuit package as recited in claim 1 further comprising an underfill material that encapsulates the plurality of electrical connectors and passes through the openings in the first lead frame to come in contact with the overlying substrate.

3. An integrated circuit package as recited in claim 1 further comprising a first electrical connector that directly connects the active surface of the first integrated circuit die and one of the contacts on the substrate.

4. An integrated circuit package as recited in claim 3 wherein the first electrical connector is formed from at least two stacked solder balls.

5. An integrated circuit package as recited in claim 1 wherein the first passive device is mounted on and electrically connected to one of the contacts of the substrate and is electrically coupled with the first integrated circuit die through the substrate and the first lead frame.

6. An integrated circuit package as recited in claim 1 wherein:
the first lead frame includes a plurality of outer leads that are at the periphery of the first lead frame and that are arranged to be electrically connected to an electrical device that is outside of the integrated circuit package;
the plurality of inner leads of the first lead frame are situated inward and away from the periphery of the first lead frame; and
the electrical connectors that couple the plurality of inner leads to the active surface of the first integrated circuit die are solder joints.

7. An integrated circuit package as recited in claim 1 further comprising a molding material that at least partially encapsulates the first lead frame, the second lead frame and the first integrated circuit die wherein the molding material leaves a portion of the second lead frame uncovered.

8. An integrated circuit package as recited in claim 1 further comprising a plurality of integrated circuit die including the first integrated circuit die and a plurality of passive devices including the first passive device wherein:
the plurality of passive devices includes a second passive device;
the first passive device is electrically and physically connected to one of the contacts on the substrate; and
the second passive device is electrically and physically connected to the first lead frame.

9. An integrated circuit package as recited in claim 1 wherein the substrate is made from one selected from the group consisting of (a) bismaleimidetriazine (BT) and (b) FR4.

10. An integrated circuit package as recited in claim 1 wherein:
the first lead frame, the substrate and the second lead frame each include a top surface and an opposing bottom surface;
the substrate overlies the top surface of the first lead frame;
the active surface of the first integrated circuit die is electrically and physically attached to the bottom surface of the first lead frame;
the back surface of the first integrated circuit die is electrically and physically attached to the top surface of the second lead frame; and
the bottom surface of the second lead frame is exposed on the exterior of the integrated circuit package.

* * * * *